United States Patent
Chen et al.

(10) Patent No.: US 10,050,092 B2
(45) Date of Patent: Aug. 14, 2018

(54) ARRAY SUBSTRATE, MANUFACTURING METHOD THEREOF AND DISPLAY DEVICE

(71) Applicant: BOE TECHNOLOGY GROUP CO., LTD., Beijing (CN)

(72) Inventors: Jiangbo Chen, Beijing (CN); Can Wang, Beijing (CN); Huifeng Wang, Beijing (CN); Wenfeng Song, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 14/891,796

(22) PCT Filed: Apr. 16, 2015

(86) PCT No.: PCT/CN2015/076777
§ 371 (c)(1),
(2) Date: Nov. 17, 2015

(87) PCT Pub. No.: WO2016/086568
PCT Pub. Date: Jun. 9, 2016

(65) Prior Publication Data
US 2016/0197128 A1     Jul. 7, 2016

(30) Foreign Application Priority Data
Dec. 2, 2014   (CN) .......................... 2014 1 0723212

(51) Int. Cl.
*H01L 27/32*   (2006.01)
*H01L 27/12*   (2006.01)
(Continued)

(52) U.S. Cl.
CPC ........ *H01L 27/3248* (2013.01); *H01L 27/124* (2013.01); *H01L 27/1225* (2013.01);
(Continued)

(58) Field of Classification Search
CPC ........... H01L 27/3248; H01L 29/41733; H01L 29/78633; H01L 27/124; H01L 27/1225;
(Continued)

(56) References Cited

U.S. PATENT DOCUMENTS

| 2005/0110716 A1* | 5/2005 | Eida ................... H01L 27/3248 345/76 |
| 2007/0152217 A1* | 7/2007 | Lai ...................... H01L 27/1225 257/59 |

(Continued)

FOREIGN PATENT DOCUMENTS

| CN | 102629077 A | 8/2012 |
| CN | 102969361 A | 3/2013 |

(Continued)

OTHER PUBLICATIONS

Chinese Office Action dated Oct. 10, 2016.
Search Report and Written Opinion dated Sep. 6, 2015 from State Intellectual Property Office of the P.R. China.

*Primary Examiner* — Fernando L Toledo
*Assistant Examiner* — Adam S Bowen
(74) *Attorney, Agent, or Firm* — Dilworth & Barrese, LLP.; Michael J. Musella, Esq.

(57) ABSTRACT

An array substrate, a manufacturing method thereof and a display device are disclosed. The array substrate includes a substrate (10) and first thin-film transistors (TFTs) (21) and first electrodes (40) formed on the substrate (10). The first TFT (21) includes a gate electrode (200), an active layer (202), a source electrode (205) and a drain electrode (204). The first electrode (40) is electrically connected with the drain electrode (204) of the first TFT (21), at least covers an area of the active layer (202) of the first TFT, not overlapped with the source electrode (205) and the drain electrode (204), and can absorb ultraviolet (UV) light. The array substrate can solve the problem of reducing the display (Continued)

performance of the display device as the performances degrade and even fail due to UV irradiation of the TFTs.

19 Claims, 4 Drawing Sheets

(51) Int. Cl.
*H01L 51/52* (2006.01)
*H01L 51/56* (2006.01)
*H01L 29/417* (2006.01)
*H01L 29/786* (2006.01)

(52) U.S. Cl.
CPC .... *H01L 27/3262* (2013.01); *H01L 29/41733* (2013.01); *H01L 29/78633* (2013.01); *H01L 51/5203* (2013.01); *H01L 51/56* (2013.01); *H01L 2227/323* (2013.01); *H01L 2251/308* (2013.01)

(58) Field of Classification Search
CPC . H01L 27/3262; H01L 51/5203; H01L 51/56; H01L 2251/308; H01L 2227/323
See application file for complete search history.

(56) References Cited

U.S. PATENT DOCUMENTS

| | | | |
|---|---|---|---|
| 2009/0225251 A1* | 9/2009 | Kaitoh | G02F 1/1303 349/46 |
| 2011/0008640 A1* | 1/2011 | Goto | C22C 21/00 428/551 |
| 2011/0031491 A1* | 2/2011 | Yamazaki | G02F 1/136227 257/43 |
| 2012/0032179 A1* | 2/2012 | Saitoh | H01L 21/0245 257/59 |
| 2012/0313098 A1* | 12/2012 | Kim | H01L 51/5012 257/59 |
| 2013/0015450 A1* | 1/2013 | Kim | H01L 51/5275 257/59 |
| 2013/0175512 A1* | 7/2013 | Kim | H01L 51/5004 257/40 |
| 2015/0070556 A1* | 3/2015 | Joei | H01L 27/307 348/311 |
| 2015/0070641 A1* | 3/2015 | Uemura | G02F 1/136209 349/123 |
| 2015/0108467 A1* | 4/2015 | Moriguchi | H01L 27/1225 257/43 |
| 2015/0162500 A1* | 6/2015 | Kim | H01L 33/42 257/773 |

FOREIGN PATENT DOCUMENTS

| | | |
|---|---|---|
| CN | 104362157 A | 2/2015 |
| JP | 2003215615 A | 7/2003 |
| JP | 2008262942 A | 10/2008 |

* cited by examiner

ARRAY SUBSTRATE, MANUFACTURING METHOD THEREOF AND DISPLAY DEVICE

TECHNICAL FIELD

Embodiments of the present invention relate to an array substrate, a manufacturing method thereof and a display device.

BACKGROUND

Thin-film transistors (TFTs) are important components of a drive circuit and are widely applied in display devices. A TFT mainly comprises a gate electrode, an active layer, a source electrode, and a drain electrode; the switching performance of the TFT is degraded if the electrical properties are changed after the active layer is suffered from ultraviolet (UV) irradiation, and the phenomenon is more serious when the active layer is made from a metal oxide with high mobility and good uniformity.

For instance, regarding a polymer light-emitting diode (PLED) display device, the PLED display device comprises an array substrate and a package substrate. As illustrated in FIG. 1, the array substrate comprises a substrate 10 and TFTs and a passivation layer 30 formed on the substrate 10 in sequence; the TFT includes a gate electrode 200, a gate insulating layer 201, an active layer 202, an etch barrier layer 203, a source electrode 205 and a drain electrode 204; and the active layer 202 is made from a metal oxide such as indium gallium zinc oxide (IGZO).

The array substrate of the PLED display device further comprises an emission layer (EML) formed on the substrate. Currently, the EML of the PLED display device is mostly formed through an inkjet printing technology. In order to further optimize the inkjet printing technology, the array substrate is generally cleaned and modified with UV light before the EML is formed. Because a metal oxide has the defect of poor stability due to UV irradiation, when the array substrate is cleaned and modified with UV light, the active layer is subjected to UV irradiation and the electrical properties are changed, so that the switching performance of the TFT is degraded and the TFT even fails, and hence the display performance of the PLED display device can be reduced.

SUMMARY

Embodiments of the present invention provide an array substrate, a manufacturing method thereof and a display device, which solve the problem that the display performance of the display device is degraded and even fail commonly due to the UV irradiation of a TFT.

An embodiment of the present invention provides an array substrate, which comprises a substrate, and a first TFT and a first electrode that are formed on the substrate. The first TFT includes a gate electrode, an active layer, a source electrode and a drain electrode. The first electrode is electrically connected with the drain electrode of the first TFT, at least covers an area of the active layer of the first TFT, which area is not overlapped with the source electrode and the drain electrode, and is capable of absorbing UV light.

An embodiment of the present invention further provides a display device, which comprises the foregoing array substrate.

An embodiment of the present invention further provides a method for manufacturing an array substrate. The manufacturing method comprises: forming a first TFT on a substrate, including forming a gate electrode, an active layer, a source electrode and a drain electrode; and forming a first electrode on the substrate provided with the first TFT, in which the first electrode is electrically connected with the drain electrode of the first TFT, at least covers an area of the active layer of the first TFT, which area is not overlapped with the source electrode and the drain electrode, and is capable of absorb UV light.

BRIEF DESCRIPTION OF THE DRAWINGS

For more clear understanding of the technical proposals in the embodiments of the present invention or the prior art, simple description will be given below to the accompanying drawings required to be used in the description of the embodiments or the prior art. Obviously, the accompanying drawings described below only involve some embodiments of the present invention, and other accompanying drawings may also be obtained by those skilled in the art without creative efforts on the basis of the accompanying drawings.

REFERENCE NUMERALS

10—Substrate; 21—First TFT; 22—Second TFT; 200—Gate Electrode; 201—Gate Insulating Layer; 202—Active Layer; 203—Etch Barrier Layer; 204—Drain Electrode of First TFT; 205—Source Electrode of First TFT; 224—Drain Electrode of Second TFT; 225—Source Electrode of Second TFT; 220—Area of Active Layer of Second TFT not Overlapped with Source Electrode and Drain Electrode; 230—Area of Active Layer of First TFT not Overlapped with Source Electrode and Drain Electrode; 30—Passivation Layer; 40—First Electrode; 50—Pixel Define Layer (PDL); 60—emission layer; 70—Second Electrode.

DETAILED DESCRIPTION

Clear and complete description will be given below to the technical proposals in the embodiments of the present invention with reference to the accompanying drawings in the embodiments of the present invention. Obviously, the preferred embodiments are only partial embodiments of the present invention and not all the embodiments. All the other embodiments obtained by those skilled in the art without creative efforts on the basis of the embodiments of the present invention shall fall within the scope of protection of the present invention.

It should be noted that "on" and "beneath" in the embodiments of the present invention are based on the forming sequence of layer structures; and previously formed layer structures are disposed on the lower part, and subsequently formed layer structures are disposed on the upper part. In the embodiments of the present invention, source electrodes and drain electrodes are relative to each other and can be exchanged as required in actual use.

Figure 1:
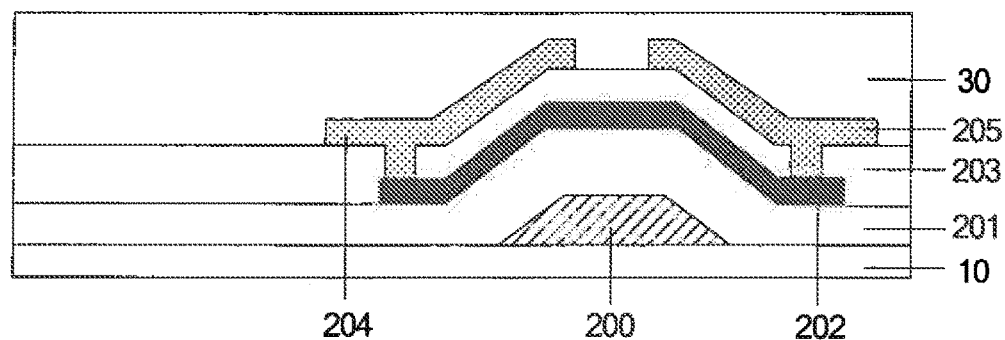
FIG. 1 is a schematic structural view of an array substrate.
Figure 2:
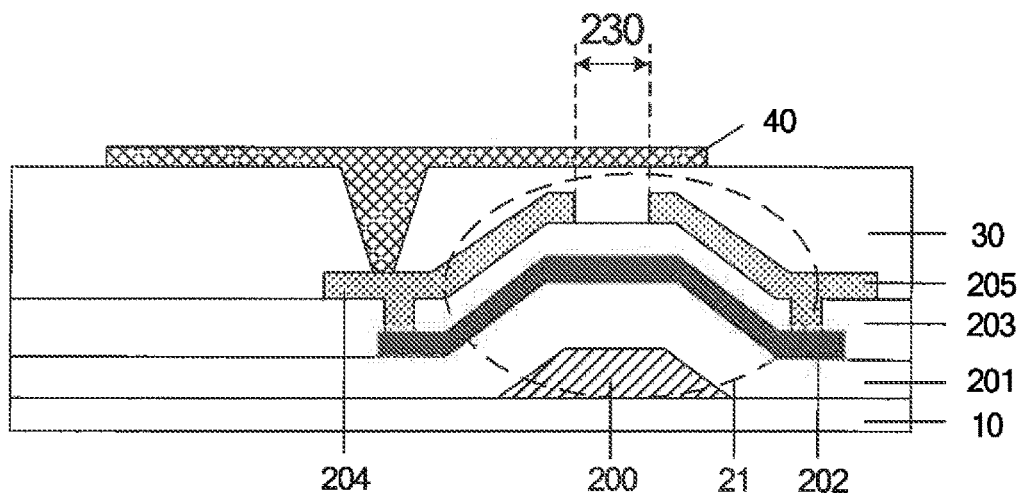
FIG. 2 is a schematic structural view of an array substrate provided by an embodiment of the present invention.

At least one embodiment of the present invention provides an array substrate, which, as illustrated in FIG. 2, comprises a substrate 10, and a first TFT 21 and a first electrode 40 that are formed on the substrate 10. The first TFT 21 includes a gate electrode 200, an active layer 202, a drain electrode 204 and a source electrode 205. The first electrode 40 is electrically connected with the drain electrode 204 of the first TFT, at least covers an area of the active layer 202 of the first TFT 21, which area is not overlapped with the source electrode 205 and the drain electrode 204, and can absorb UV light.

In the array substrate, the area of the first electrode covering the first TFT is not limited. That is to say, the first electrode may cover only the area of the active layer of the first TFT, which area is not overlapped with the source electrode and the drain electrode, or may cover the entire first TFT, or may cover the first and other areas, as long as the first electrode at least covers the area of the active layer of the first TFT, which area is not overlapped with the source electrode and the drain electrode. In addition, the material and the thickness of the first electrode are also not limited herein as long as the first electrode has the characteristic of absorbing UV light.

In the array substrate, the material of forming the active layer is also not limited. The active layer may be made from a silicon-based material such as amorphous silicon (a-Si) and polysilicon (poly-Si), or may also be made from a non-silicon-based material such as metal oxide, which can be specifically selected according to actual conditions.

It should be noted that the array substrate may be used for forming liquid crystal display (LCD) display devices and may also be used for forming organic light-emitting diode (OLED) display devices. When the array substrate is used for forming the LCD display device, the first electrode may be a pixel electrode and the drain electrode of the first TFT is electrically connected with the first electrode, so that a voltage is supplied to the first electrode through the first TFT. When the array substrate is used for forming the OLED display device, the first electrode may be used as an anode and may also be used as a cathode, and the first TFT may be a driving transistor and configured to supply a current for the first electrode.

An embodiment of the present invention provides an array substrate. A first electrode is formed in the array substrate and electrically connected with a drain electrode of a first TFT and at least covers an area of an active layer of the first TFT, not overlapped with a source electrode and a drain electrode. As the first electrode can absorb UV light, most UV light irradiated to the area of the active layer of the first TFT, not overlapped with the source electrode and the drain electrode, is absorbed by the first electrode, and only a small amount of UV light is transmitted from the first electrode and irradiated to the area of the active layer of the first TFT, not overlapped with the source electrode and the drain electrode, so that the phenomenon that the UV light is irradiated to the area of the active layer of the first TFT, not overlapped with the source electrode and the drain electrode, can be greatly avoided, and hence the problem that the display performance of the display device is degraded and even fails due to the UV irradiation on the TFT can be effectively solved.

Moreover, the first electrode may cover the first TFT, so that the influence of the UV light on the first TFT can be greatly reduced.

For instance, in order to improve the ability of the first electrode to absorb the UV light, the inventor has noted that the first electrode may be made from ITO, GZO or IZO. The materials have a strong UV adsorption capacity.

Moreover, the thickness of the first electrode may be 30 nm to 300 nm. For instance, the thickness of the first electrode is 70 nm. Therefore, not only the cost can be reduced but also the requirement of the first electrode on absorbing the IN light can be met.

For instance, when the absorbance of the first electrode with respect to the UV light of a wavelength less than 300 nm is not less than 90%, the first electrode may absorb most UV light with a wavelength less than 300 nm. In an actual application, UV light with a wavelength of 254 nm and 185 nm is mostly adopted to perform UV cleaning and modification on the array substrate, so that the influence of the UV light on the TFTs when the array substrate is cleaned and modified with UV light can be avoided.

Figure 3:
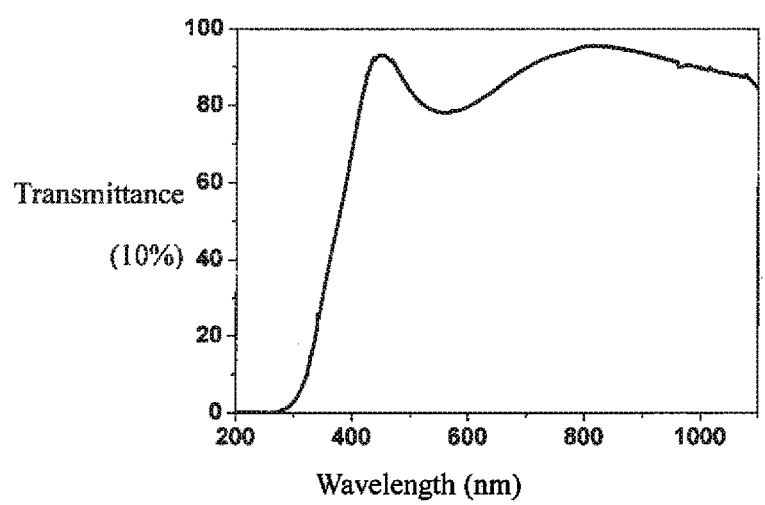
FIG. 3 is a transmission spectrogram of ITO.

Detailed description is given by taking the case that the first electrode is made from ITO as an example. As illustrated in FIG. 3, the vertical coordinate in FIG. 3 represents the light transmittance and the horizontal ordinate represents the light wavelength, and correspondingly when light transmittance is lower, capacity of the material for absorbing the light with the light wavelength is stronger. In general, the wavelength range of UV light is 10 nm to 380 nm. It can be obviously seen from FIG. 3 that the transmittance of the first electrode made from ITO with respect to the UV light of a wavelength less than 300 nm is not more than 10%, namely the absorbance is not less than 90%. It is indicated that the first electrode made from ITO has strong an absorption capacity with respect to the UV light of wavelength less than 300 nm.

For instance, the first electrode may be taken as a cathode or an anode, so that an absorption layer used for absorbing the UV light is not required to be independently formed. Therefore, one patterning process can be reduced, and hence the production cost can be reduced. It should be noted that the cathode and the anode herein are relevant to the current direction of the EML. The cathode is configured to transmit electrons to the EML, and the anode is configured to transmit holes to the EML.

Figure 7:
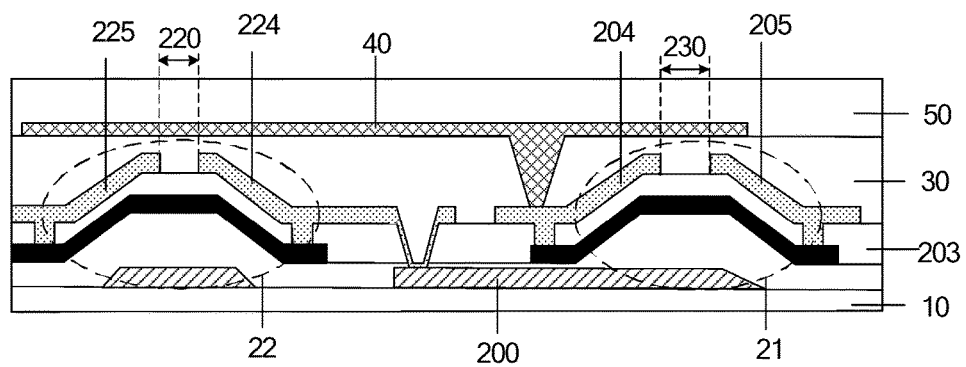
FIG. 7 is a schematic diagram of the step S03 in FIG. 4.

For instance, in order to protect the TFT, the array substrate further comprises a passivation layer. As illustrated in FIG. 2, the passivation layer 30 may be formed between the first electrodes 40 and the first TFT 2. As illustrated in FIG. 7, the passivation layer 30 may also be formed on the first TFT 21 and the second TFT 22 and beneath the first electrode 40.

For instance, the array substrate further comprises an EML. The first electrode is disposed between the EML and the first TFT. For instance, the EML may be formed through the evaporation of an organic small molecular electroluminescent material and may also be formed by the inkjet printing of an organic polymer electroluminescent material. In order to improve the performance of the EML, the array substrate is generally subjected to UV cleaning before the EML is formed. The process is necessary particularly when the EML is formed by inkjet printing. In UV cleaning, the UV light will affect the performance of the first TFT. In order to reduce the influence degree on the first TFT, the first electrode is disposed between the EML and the first TFT. Therefore, in UV cleaning, the first electrode may absorb most UV light and hence has the function of protecting the first TFT.

Moreover, for instance, the array substrate further comprises a second electrode which is formed on the EML.

Therefore, after application of a voltage, an electric field may be formed between the second electrode and the first electrode to drive the EML to emit light. It should be noted that the second electrode and the first electrode may not be taken as the anode or the cathode at the same time. That is to say, when the first electrode is taken as the anode, the second electrode can only be taken as the cathode; or when the first electrode is taken as the cathode, the second electrode can only be taken as the anode.

For instance, the array substrate may further comprise a color filter (CF) layer disposed between the passivation layer and the first electrodes. For instance, the CF layer may include red, green, blue and white subpixels. Moreover, a planarization layer may be formed between the CF layer and the first electrode and configured to protect the CF layer. The array substrate may be used for forming a white organic light-emitting diode (WOLED) display device. The WOLED display device can be easily manufactured to have a large size and has the advantage of ultra high resolution.

Moreover, in an embodiment, when the array substrate is used for forming an OLED display device, the array substrate further comprises a second TFT. A drain electrode of the second TFT is electrically connected with the gate electrode of the first TFT, so that the input voltage of the first TFT can be controlled, and hence the output current of the second TFT can be controlled. Similarly, the UV light will also affect the performance of the second TFT, so that the first electrode also at least covers an area of an active layer of the second TFT, which area is not overlapped with the source electrode of the second TFT and the drain electrode of the second TFT, and hence the second TFT can be protected. For instance, the first electrode may also cover the second TFT.

For instance, in the array substrate, the active layer may be made from IGZO or indium tin zinc oxide (ITZO). Because IGZO or ITZO has high mobility, the formed display device has the characteristics of rapid response speed and high resolution.

At least one embodiment of the present invention further provides a display device, which comprises any foregoing array substrate. The display device may be a display such as an OLED display and an LCD display or any product or component having display function and comprising the display, e.g., a TV, a digital camera, a mobile phone, a watch, a tablet PC, a notebook computer and a navigator.

At least one embodiment of the present invention further provides a method for manufacturing an array substrate, which comprises: forming a first TFT on a substrate, including the step of: forming a gate electrode, an active layer, a source electrode and a drain electrode; and forming a first electrode on the substrate. The first electrode is electrically connected with the drain electrode of the first TFT, at least covers an area of the active layer of the first TFT, not overlapped with the source electrode and the drain electrode, and can absorb UV light.

An embodiment of the present invention provides a method for manufacturing an array substrate. In the array substrate, a first electrode and a first TFT are formed; and the first electrode is electrically connected with a drain electrode of the first TFT and at least covers an area of an active layer of the first TFT, not overlapped with a source electrode and the drain electrode. As the first electrode can absorb UV light, most UV light irradiated to the area of the active layer of the first TFT, not overlapped with the source electrode and the drain electrode, is absorbed by the first electrode, and only a small amount of UV light is transmitted from the first electrode and irradiated to the area of the active layer of the first TFT, not overlapped with the source electrode and the drain electrode, so that the phenomenon that the UV light is irradiated to the area of the active layer of the first TFT, not overlapped with the source electrode and the drain electrode, can be greatly avoided, and hence the problem that the display performance of the display device is degraded and even fails due to the UV irradiation of the TFTs can be effectively solved.

Figure 4:
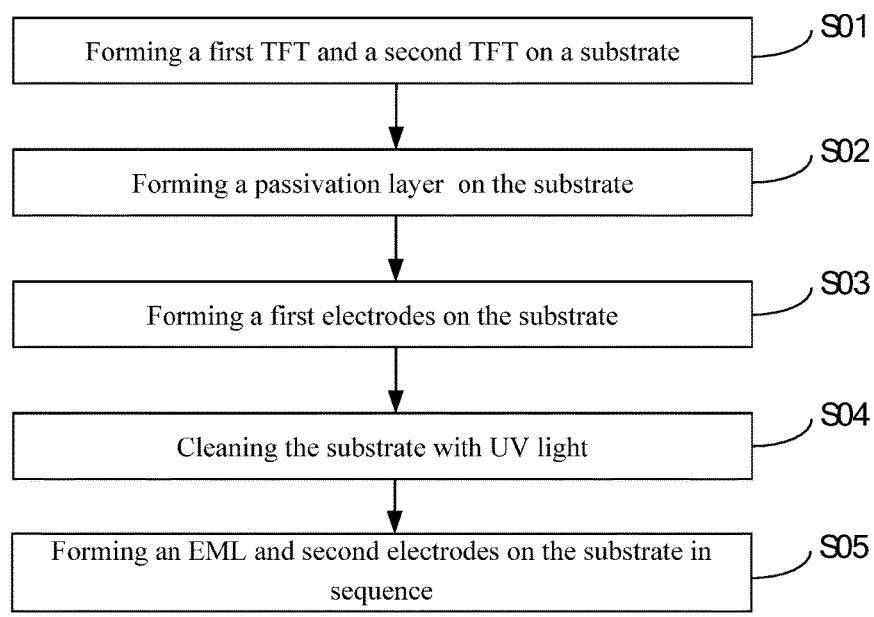
FIG. 4 is a flowchart of a method for manufacturing an array substrate, provided by an embodiment of the present invention.

Detailed description will be given below by taking the case that the array substrate further comprises a second TFT and the first electrode also at least covers an area of an active layer of the second TFT, not overlapped with a source electrode of the second TFT and a drain electrode of the second TFT, as an example. The manufacturing method may, as shown in FIG. 4, comprises the following steps.

Figure 5:
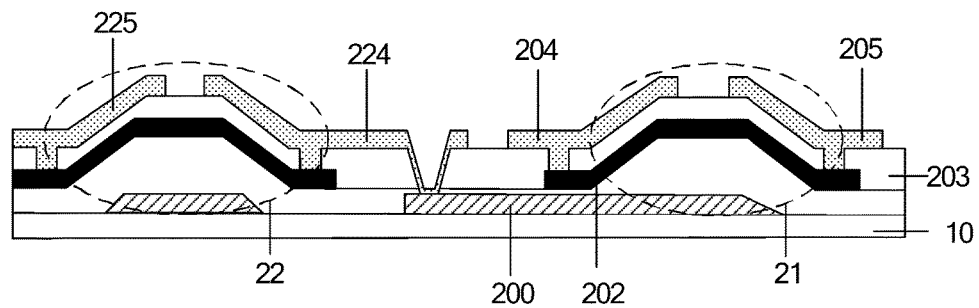
FIG. 5 is a schematic diagram of the step S01 in FIG. 4.

S01: as illustrated in FIG. 5, forming a first TFT 21 and a second TFT 22 on a substrate 10, in which a drain electrode 224 of the second TFT 22 is electrically connected with a gate electrode 200 of the first TFT 21.

It should be noted that the first TFTs 21 and the second TFTs 22 may be formed at the same time; or the first TFT 21 may be formed at first and hence the second TFT 22 is formed; or the second TFT 22 may be formed at first and hence the first TFT 21 is formed. No specific limitation will be given here in the embodiment of the present invention, as long as the drain electrode of the second TFT 22 is electrically connected with the gate electrode of the first TFT 21.

Figure 6:
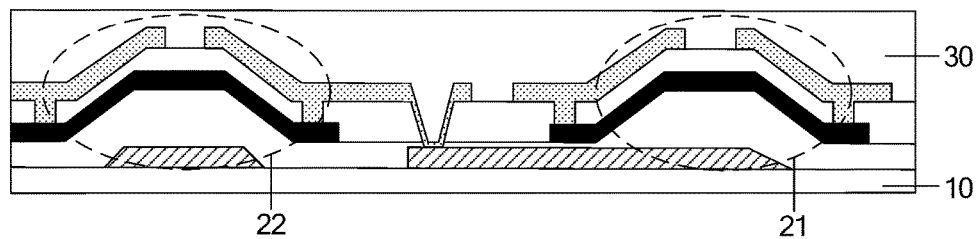
FIG. 6 is a schematic diagram of the step S02 in FIG. 4.

S02: as illustrated in FIG. 6, forming a passivation layer 30 on the substrate 10, in which the passivation layer 30 covers the first TFT 21 and the second TFT 22.

S03: as illustrated in FIG. 7, forming a first electrode 40 on the substrate 10, in which the first electrode 40 is electrically connected with a drain electrode 204 of the first TFT 21 and at least covers an area 230 of an active layer 202 of the first TFT 21, not overlapped with a source electrode 205 of the first TFT 21 and the drain electrode 204 of the first TFT 21, and an area 220 of an active layer of the second TFT 22, not overlapped with a source electrode of the second TFT 22 and the drain electrode of the second TFT 22. For instance, the first electrode at least covers the first TFT 21 and the second TFT 22. Moreover, a passivation layer 30 that is formed between the first TFT 21 and the first electrode 40 may be configured to protect the first TFT 21. For instance, in order to better achieve the display of different pixels, a pixel define layer (PDL) 50 may be further formed on the first electrode 40. Furthermore, for instance, the first electrode 40 may be taken as a cathode or an anode, so that an absorption layer for absorbing UV light is not required to be independently formed. Therefore, one patterning process can be reduced, and hence the production cost can be reduced.

S04: cleaning the substrate with UV light.

Figure 8:
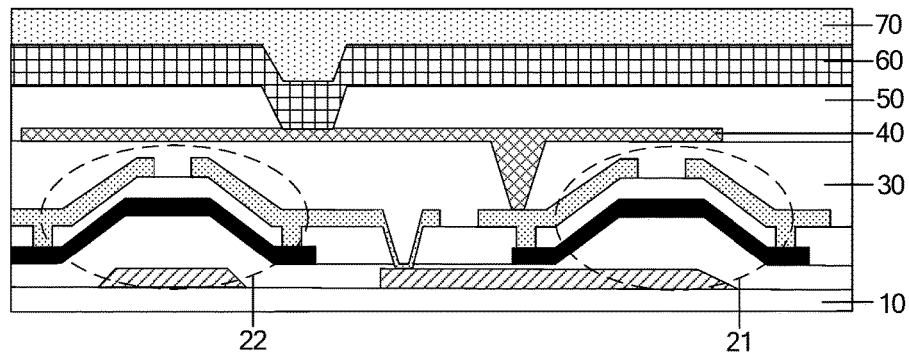
FIG. 8 is a schematic diagram of the step S05 in FIG. 4.

S05: as illustrated in FIG. 8, forming an EML 60 and a second electrode 70 on the substrate 10 in sequence. For instance, the EML may be formed through evaporation of an organic small molecular electroluminescent material or may be formed through inkjet printing of an organic polymer electroluminescent material. No specific limitation will be given herein in the embodiment of the present invention.

Figure 9:
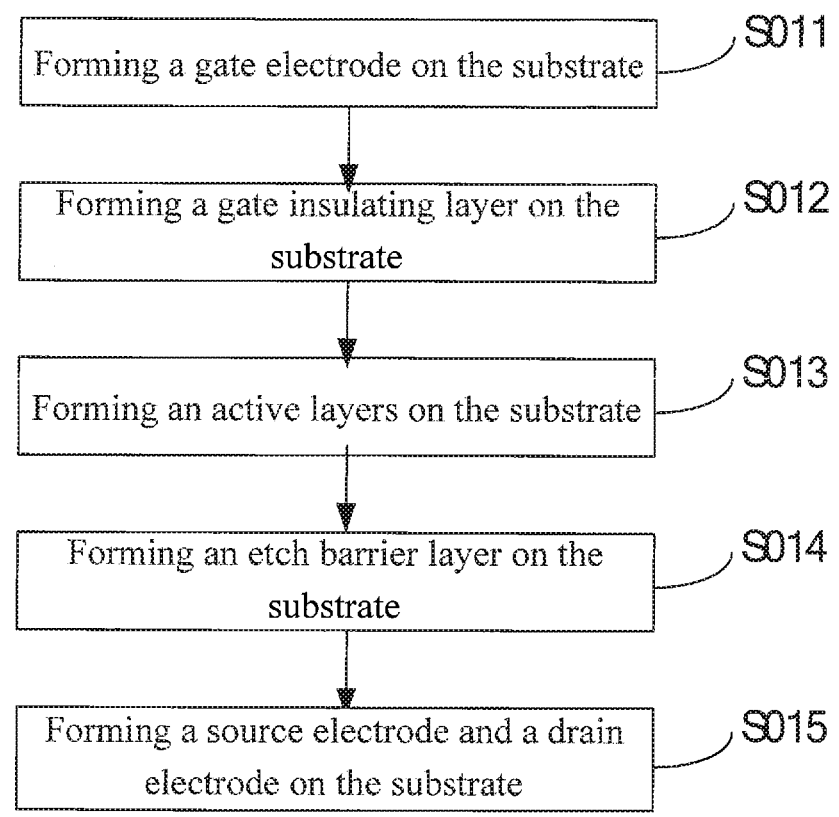
FIG. 9 is a flowchart illustrating the process of forming a first TFT.

The manufacturing method, in which detailed description is given to the step S01 by taking the process of forming the first TFTs as an example, may be as shown in FIG. 9. The method comprises the following steps.

S011: forming a gate electrode on the substrate.

S012: forming a gate insulating layer on the substrate by chemical vapor deposition (CVD), in which the gate insulating layer may be a single-layer film such as silicon oxide (SiOx) and silicon nitride (SiNx) or a multi-layer film.

S013: forming an active layer on the substrate, in which the active layer may be an oxide film such as IGZO and ITZO.

S014: forming an etch barrier layer on the substrate, in which the etch barrier layer may be a SiOx film.

S015: forming a source electrode and a drain electrode on the substrate.

It should be noted that the manufacturing method of the second TFT is the same with the manufacturing method of the first TFT. No further description will be given here. The foregoing is only illustrative description on the manufacturing method and the structure of the TFTs. The structure and the manufacturing method of the TFTs are not limited in the present invention.

The foregoing is only the preferred embodiments of the present invention and not intended to limit the scope of protection of the present invention. Any change or replacement that may be easily thought of by those skilled in the art within the technical scope disclosed by the present invention shall fall within the scope of protection of the present invention. Therefore, the scope of protection of the present invention shall be defined by the appended claims.

The application claims priority to the Chinese patent application No. 201410723212.2, filed on Dec. 2, 2014, the disclosure of which is incorporated herein by reference as part of the application.

The invention claimed is:

1. An array substrate, comprising a substrate, a first thin film transistor (TFT), a second TFT and a first electrode formed on the substrate, the first TFT including a first gate electrode, a first active layer, a first source electrode and a first drain electrode, and the second TFT including a second gate electrode, a second active layer a second source electrode and a second drain electrode, wherein the first electrode is electrically connected with the drain electrode of the first TFT, at least covers an area of the active layer of the first TFT, which area is not overlapped with the source electrode and the drain electrode, and is capable of absorbing ultraviolet (UV) light;

the second drain electrode of the second TFT is electrically connected with the first gate electrode of the first TFT; and the first electrode also at least covers an area of the second active layer of the second TFT, which area is not overlapped with the second source electrode of the second TFT and the first drain electrode of the second TFT;

the first gate electrode of the first TFT is disposed at a side of the first active layer near the substrate, and the second gate electrode of the second TFT is disposed at a side of the second active layer near the substrate.

2. The array substrate according to claim 1, wherein the first electrode covers the first TFT.

3. The array substrate according to claim 1, wherein the first electrode is made from indium tin oxide (ITO), gallium zinc oxide (GZO) or indium zinc oxide (IZO).

4. The array substrate according to claim 1, wherein a thickness of the first electrode is from 30 nm to 300 nm.

5. The array substrate according to claim 1, wherein absorbance of the first electrode with respect to UV light of a wavelength less than 300 nm is not less than 90%.

6. The array substrate according to claim 1, wherein the first electrode is a cathode or an anode.

7. The array substrate according to claim 1, wherein the first electrode also covers the second TFT.

8. The array substrate according to claim 1, wherein the first active layer is made from an oxide semiconductor material.

9. The array substrate according to claim 1, further comprising a passivation layer, an emission layer (EML) and a second electrode formed on the substrate, wherein
the passivation layer is formed between the first electrode and the first TFT; and the EML and the second electrode are formed on the first electrode in sequence.

10. A display device, comprising the array substrate according to claim 1.

11. The array substrate according to claim 1, wherein the first TFT further comprises a etch barrier layer disposed between the first source electrode/the first drain electrode of the first TFT and the first active layer of the first TFT, and the first source electrode and the first drain electrode are connected with the first active layer through via holes in the etch barrier layer.

12. A method for manufacturing an array substrate, comprising:
forming a first thin film transistor (TFT) on a substrate, including forming a first gate electrode, a first active layer, a first source electrode and a first drain electrode sequentially;
forming a second TFT on the substrate, including forming a second gate electrode, a second active layer, a second source electrode and a second drain electrode sequentially, in which the second drain electrode of the second TFT is electrically connected with the first gate electrode of the first TFT; and
forming a first electrode on the substrate provided with the first TFT, in which the first electrode is electrically connected with the first drain electrode of the first TFT, at least covers an area of the first active layer of the first TFT, which area is not overlapped with the first source electrode and the first drain electrode, and is capable of absorbing ultraviolet (UV) light; the first electrode also at least covers an area of the second active layer of the second TFT, which area is riot overlapped with the second source electrode of the second TFT and the second drain electrode of the second TFT.

13. The manufacturing method according to claim 12, wherein the first electrode covers the first TFT.

14. The manufacturing method according to claim 12, wherein a thickness of the first electrode is from 30 nm to 300 nm.

15. The manufacturing method according to claim 12, wherein absorbance of the first electrode with respect to UV light of a wavelength less than 300 nm is not less than 90%.

16. The manufacturing method according to claim 12, wherein the first electrode also covers the second TFT.

17. The manufacturing method according to claim 12, after forming of the first TFT and the second TFT on the substrate and before forming of the first electrode, further comprising:
forming a passivation layer on the substrate.

18. The manufacturing method according to claim 12, after forming of the first electrode on the substrate provided with the first TFT, further comprising:
cleaning the substrate with UV light.

19. The manufacturing method according to claim 18, after cleaning the substrate with UV light, further comprising:
forming an EMI and a second electrode on the substrate in sequence.

* * * * *